United States Patent [19]

Madland

[11] Patent Number: 4,926,387

[45] Date of Patent: May 15, 1990

[54] MEMORY TIMING CIRCUIT EMPLOYING SCALED-DOWN MODELS OF BIT LINES USING REDUCED NUMBER OF MEMORY CELLS

[75] Inventor: Paul D. Madland, Beaverton, Oreg.

[73] Assignee: Intel Corporation, Santa Clara, Calif.

[21] Appl. No.: 290,257

[22] Filed: Dec. 27, 1988

[51] Int. Cl.[5] .................... G11C 11/40; G11C 13/00
[52] U.S. Cl. ............................ 365/233; 365/189.01; 365/189.05; 365/203
[58] Field of Search .............. 365/189.05, 189.01, 365/190, 189.09, 203, 230.01, 207, 230.06, 230.08, 233

[56] References Cited

U.S. PATENT DOCUMENTS

| | | |
|---|---|---|
| 4,223,394 | 9/1980 | Pathak et al. ................ 365/207 |
| 4,658,158 | 4/1987 | Chau et al. ................... 365/207 |
| 4,802,122 | 1/1989 | Auvinen et al. .............. 365/190 |
| 4,823,319 | 4/1989 | Pfennings .................... 365/190 |

Primary Examiner—Terrell W. Fears
Attorney, Agent, or Firm—Blakely, Sokoloff, Taylor & Zafman

[57] ABSTRACT

A timing circuit is described for a single phase clocked memory. A plurality of models duplicating a word line, a bit line, a cell, etc., are used in the timing circuit. The bit line model is scaled down compared to the actual bit line, however, in conjunction with the drive to the bit line (scaled up model of the cell), the signal on the bit line model is greater than the actual signal on the bit line in the array during reading. This simplifies the detection circuitry needed in the timing circuit and provides more accurate control signals.

10 Claims, 5 Drawing Sheets

FIG_1

FIG_3

FIG_5 WORD LINE MODEL

FIG_6 BIT LINE MODEL

MEMORY TIMING CIRCUIT EMPLOYING SCALED-DOWN MODELS OF BIT LINES USING REDUCED NUMBER OF MEMORY CELLS

BACKGROUND OF THE INVENTION:

1. Field of the Invention

The invention relates to semiconductor memories and in particular to timing circuits for controlling reading and writing in such memories.

2. Prior Art

In semiconductor memories, such as static and dynamic random-access memories (RAMs), a plurality of control or timing signals are typically used to access memory cells. Often, to access a cell for reading or writing, several control signals are needed, each occurring one after the other to, for example, precharge nodes, provide isolation, activate sense amplifiers, etc. The timing of these signals is critical and becomes more critical where the memory is operated at faster rates.

In early semiconductor RAMs, control signals were generated off-chip. In current memories, the control signals are generated on-chip; see, for example, U.S. Pat. No. 3,778,784. In the metal-oxide-semiconductor (MOS) memory described in the '784 patent, a timing cell is used in the timing circuits. This cell compensated for process variations which would otherwise substantially affect the timing of these timing signals.

In U. S. Pat. No. 4,087,704, another on-chip control signal arrangement is described for a dynamic RAM where the output of one control signal generator is used to initiate or trigger the next control signal generator. This arrangement assures that a delay occurs between each of the signals and that the signals occur in a predetermined order.

It is also common in semiconductor memories to employ dummy cells. These cells, for example, provide loading or charge in an amount equal to that of a real cell in the array. The dummy cells are fabricated on the same die or substrate as the true memory cells, hence, their characteristics are effectively the same as the real cells (independent of process variations). An example of dummy cells is described in U.S. Pat. No. 3,959,781.

As will be seen, the present invention employs models of actual circuit elements to provide delays in a timing circuit. The output of one model is used in some cases to activate another model, for example, a word line model initiates reading in a cell read model.

SUMMARY OF THE PRESENT INVENTION

A timing circuit for use in a memory having a plurality of cells is described. The timing circuit provides a plurality of control signals which are used to control, for example, reading of data from the memory. A bit line model which comprises a scaled-down model of an actual bit line in the memory is used. This model has less capacitance than the bit lines in the memory. A driving means is coupled to this bit line model for driving the model to duplicate reading of data from the memory cell. The driving means produces more signal on the bit line model than is obtained on the actual bit line in the memory. In the presently preferred embodiment, the driving means comprises a scaled up model of a memory cell. A detector is coupled to the bit line model for detecting the signal produced by the driving means. The output of the detector is used to provide one of the control signals for reading of data from the actual memory. The detector, since it receives more signal than is received by the sense amplifiers in the memory array, can be much smaller, faster and need not be as sensitive as the sense amplifiers used in the array.

Other aspects of the present invention will be apparent from the following detailed description of the invention.

DETAILED DESCRIPTION OF THE PRESENT INVENTION

A timing circuit for use with a semiconductor memory is described. In the following description, numerous specific details are set forth such as specific gate logic, etc., in order to provide a thorough understanding of the present invention. It will be obvious to one skilled in the art that the present invention may be practiced without these specific details. In other instances, well-known circuits have been shown in symbolic form in order not to obscure the present invention in unnecessary detail.

The present invention is realized with metal-oxide-semiconductor (MOS) technology, more specifically, with complementary MOS technology. Any one of a plurality of well-known CMOS processes may be used to realize the present invention. As currently implemented, the present invention is used as part of a cache memory where the memory cells in the cache memory are ordinary static cells. One of these cells has been shown in FIG. 1. It will be obvious that the present invention can be used in other memories. The entire memory with the timing circuit of the present invention is fabricated as an integrated circuit on the same substrate or die. This takes advantage of the fact that the process variations do not vary substantially over a single die. Hence, the characteristics of the devices in the timing circuit will be known relative to the characteristics of the devices in the memory array for a given die.

USE OF THE PRESENT INVENTION

Figure 1:
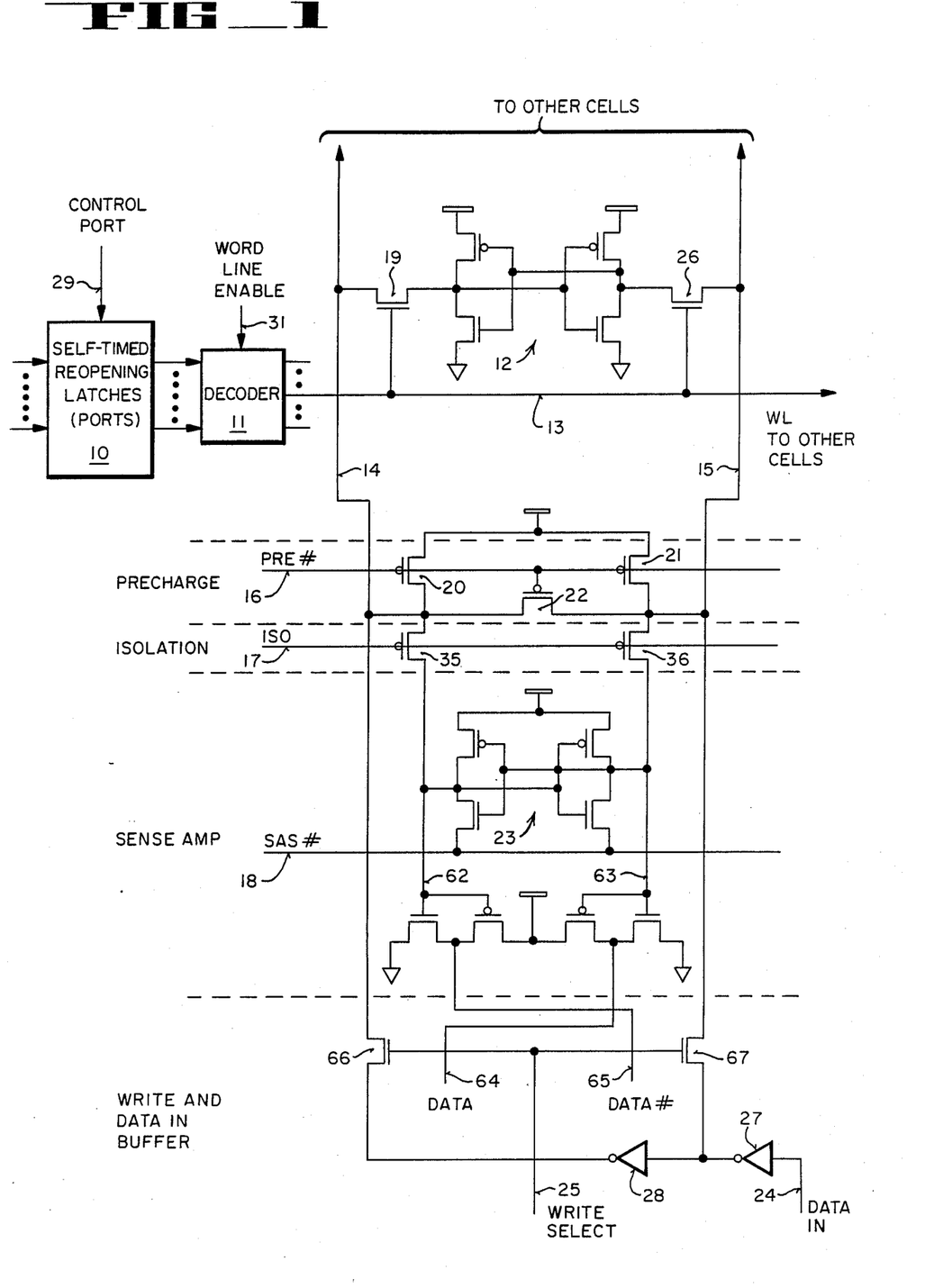
FIG. 1 is an electrical schematic of a memory cell and associated word line, bit lines, sense amplifier and write circuitry. This schematic is used to describe a portion of a memory array in which the control signals produced by the present invention are used.

Before describing the details of the present invention, knowing its use in an actual memory is helpful in understanding the invention. In FIG. 1, an ordinary static memory cell 12 is illustrated. The cell comprises a pair of cross-coupled p-channel and n-channel transistors. The memory cell is coupled to bit lines 14 and 15 through select transistors 19 and 26, respectively. The gates of the select transistors are coupled to (or are formed by) a word line 13. The bit lines are coupled to other cells in the column; and likewise the word lines extends to other cells in the row.

The memory includes self-timed reopening latches 10 which receive address signals. These latches are controlled by a control port signal on line 29. The addresses are decoded by the decoder 11. This decoder receives a word line enable (control) signal on line 31 which controls the word line timing. The decoder 11 enables a single word line at a time, as is customary, allowing a row of cells to be coupled to their respective bit lines in the array. The address inputs to the decoder do not change during the time the word line enable 31 is active.

The bit lines 14 and 15 are precharged through the p-channel transistors 20 and 21 when the potential on line 16 is low. Transistor 22 equalizes the potential of the bit lines.

Transistors 35 and 36 isolate the bit lines from the sense amplifier 23. The signal on line 17 is used to control this isolation. The sense amplifier 23 is an ordinary strobed differential amplifier which is controlled by the SAS# signal on line 18. The output from this amplifier, lines 62 and 63, is coupled to a second stage of amplification to provide the output data and its complement on lines 64 and 65, respectively, when data is read from the cell.

When data is read into the cell 12, assuming the cell is selected by the word line 13, a control signal on line 25 causes the n-channel transistors 66 and 67 to conduct, coupling the data-in line 24 to the bit lines 14 and 15. Line 24 is coupled to bit line 15 through the inverter 27 and transistor 67; the output of the inverter 27 is coupled to another inverter 28 and then to the bit line 14 through the transistor 66.

Figure 2A:
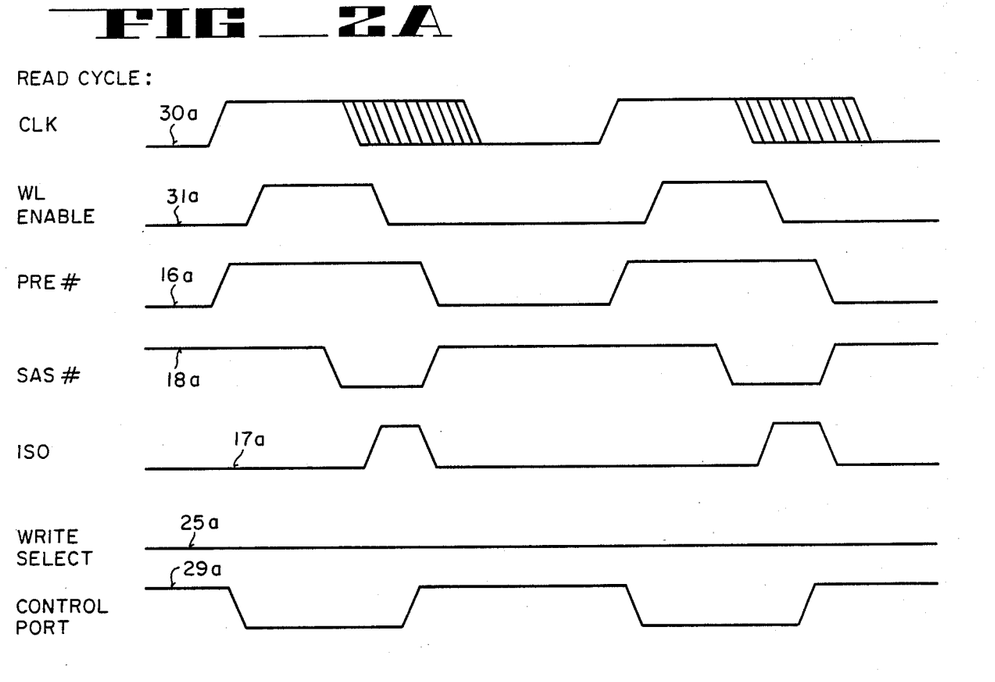
FIG. 2a illustrates a plurality of waveforms generated by the timing circuit of the present invention for a read cycle.
Figure 2B:
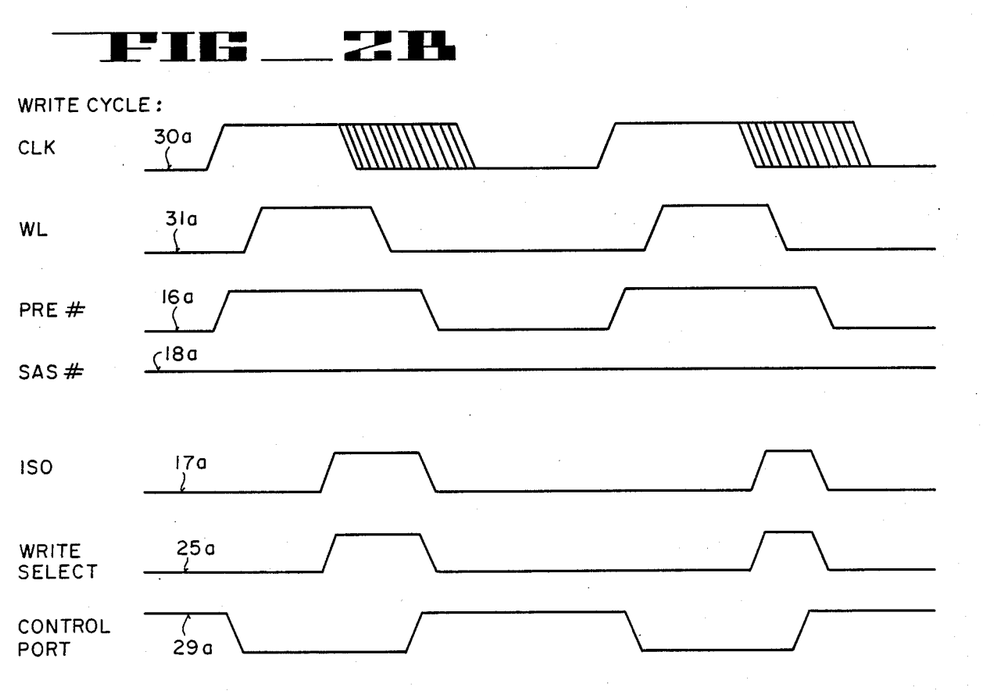
FIG. 2b illustrates a plurality of waveforms generated by the timing circuit of the present invention for a write cycle.

The control signals required to read data from or into the cell 12 are generated by the timing circuit of the present invention and are shown in FIG. 2. The control signal applied to the lines 16, 17, 18, 25, 29 and 31 of FIG. 1 are shown in FIG. 2. The same numbers are used to identify both the line carrying a signal and he signal itself. However, the letter "a" has been added to the number to distinguish the signal waveform from the line. Thus, for instance, the signal carried on line 17 of FIG. 1 is shown in FIG. 2 as the signal waveform 17a.

Figure 3:
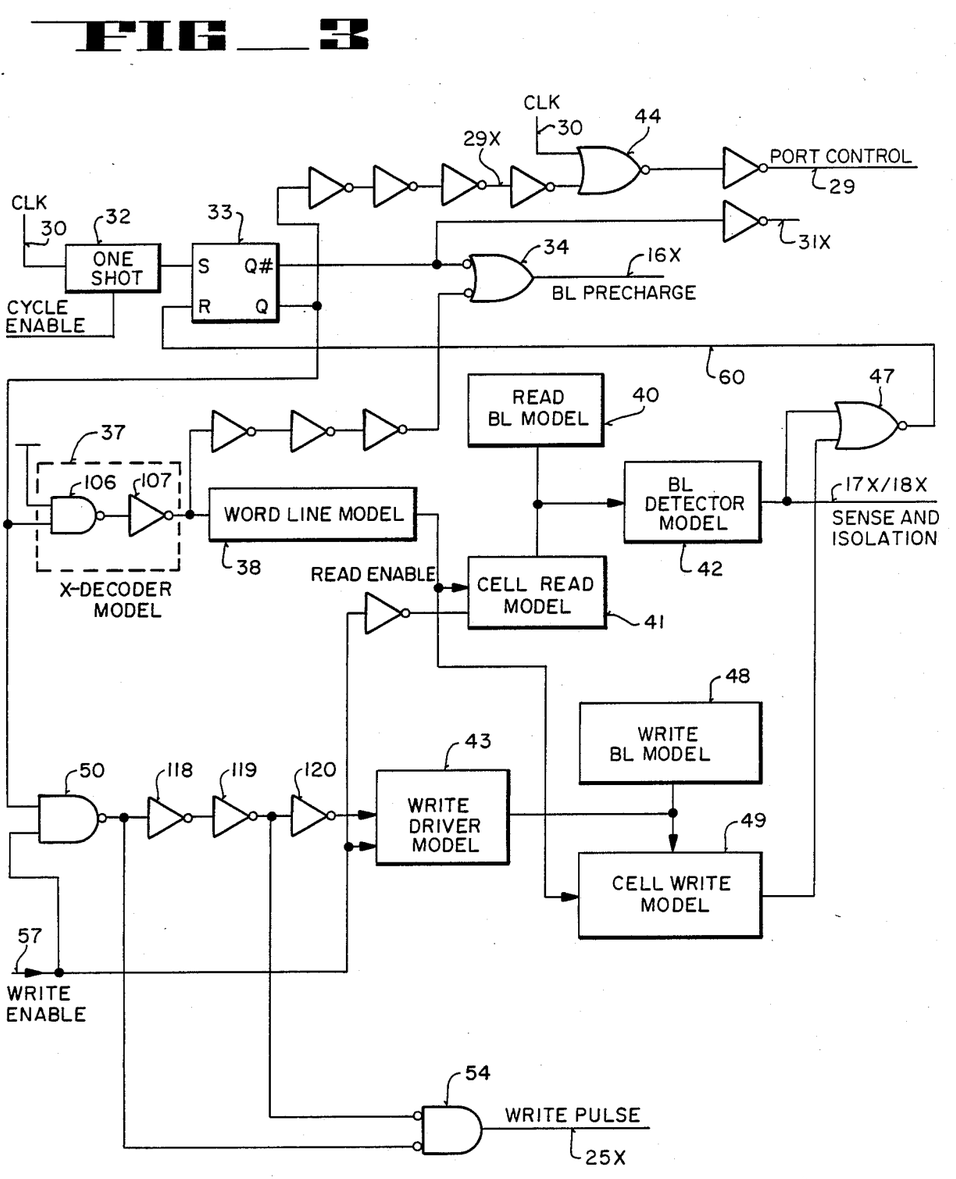
FIG. 3 is a general block diagram of the timing circuit of the present invention.
Figure 4:
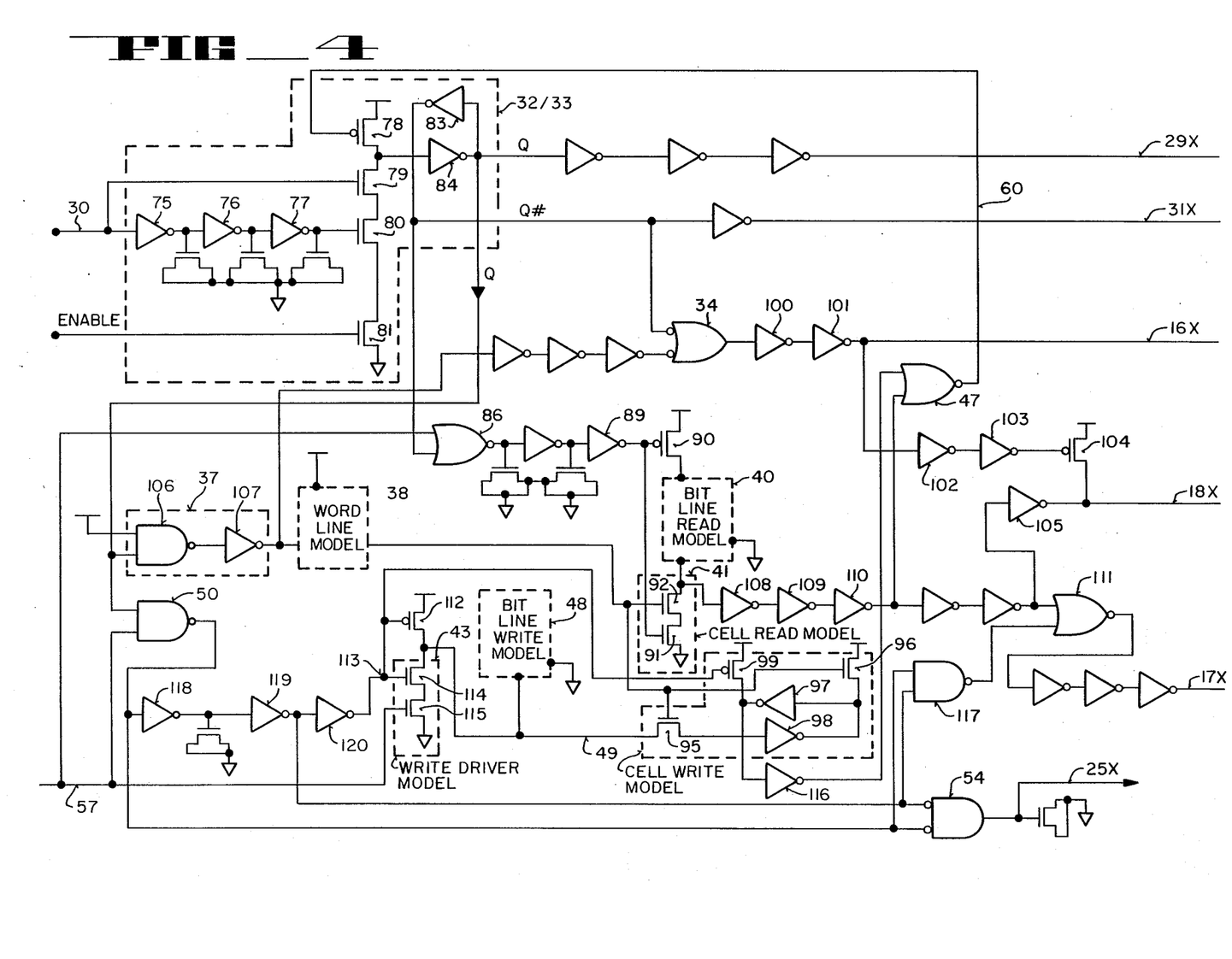
FIG. 4 is an electrical schematic of the presently preferred embodiment of the present invention.

The read and write operations occur after receipt of a single timing signal. (Writing, rather than reading, occurs if the write enable signal (line 57 of FIGS. 3 and 4) is active.) This timing signal is shown as "CLK", waveform 30a in FIG. 2. The line receiving this signal, line 30, is shown in FIGS. 3 and 4. This signal (waveform 30a) initiates the generation of the control signals of FIG. 2. Thus, after the initiation of a memory cycle the signal on line 16 rises, ending the precharging by turning off transistors 20, 21 and 22. The control port signal 29a also generated in response to the signal 30a, latches the addresses into the latches 10. This restricts further changes in the addresses presented to the decoder 11. Signal 31a allows one of the word lines at the output of the decoder 11 to be selected, such as the word line 13. Following this, the sense amplifier is activated by the sense amplifier strobe signal 18a, and after sensing is initiated, the isolation signal 17a causes transistors 35 and 36 to cease conducting.

During writing, the sense amplifier strobe signal is not generated, but rather the write select signal 25a is generated, causing the transistors 66 and 67 to conduct. This allows the data on line 24 to be coupled to the bit lines to set the cell into one of its two stable states.

OVERVIEW OF THE PRESENT INVENTION

Referring to FIG. 3 the generation of the various control signals is initiated by the clocking signal on line 30. This signal along with a cycle enable signal are applied to a one-shot 32. The output of this circuit is coupled to an SR flip-flop 33. The Q# output of this flip-flop is coupled to line 31x through an inverter. The signal on line 31x after additional buffering is the signal waveform 31a of FIG. 2. (The letter "x" is used to indicate that the line is coupled to additional buffering before becoming the final control line carrying the control signal. Thus, the signal on line 31x after passing through additional buffers (e.g., inverters) becomes the signal 31a on line 31.)

The Q output of the flip-flop 33 is coupled through four inverters to one input terminal of the NOR gate 44. The other input terminal to this NOR gate receives the clocking signal from line 30. The output of the NOR gate 44 after passing through an additional inverter provides the port control signal on line 29. (Often, in the circuits of FIGS. 3 and 4, a plurality of inverters are used in series. This is done to provide time delays to the control signals and drive for large capacitive loads.)

The Q output of the flip-flop 33 is also coupled to the series connected NAND gate 106 and inverter 107 shown within the dotted line 37. These circuit elements are a model of the decoder 11 of FIG. 1. The modeling technique employed will be better understood from the other models, such as the word line model, cell model and bit line model. However, for purposes of the decoder, the time delay through the two inverters of model 37 is the same as the time delay through the decoder 11. The output of the model 37 is coupled to the word line model 38 and through three inverters to one input terminal of the NOR gate 34. The other terminal of the NOR gate 34 receives the Q# signal from the flip-flop 33. The output of the gate 34 (line 16x) after additional buffering provides the precharge# signal 16a shown in FIG. 2.

When the clocking signal 30a is applied to the one shot multivibrator 32 a single pulse is generated causing the flip-flop 33 to be set independent of the duration of the signal 30a. When this occurs the Q# terminal of flip-flop 33 drops in potential causing the output of gate 34 to rise in potential, thereby ceasing precharging. The propagation of the Q signal through model 37 and the three inverters coupling the model 37 then to gate 34 does not change the output of gate 34 at this time. The output from the model 37, after propagating through other models (as will be discussed later) reaches gate 47 and causes the flip-flop 33 to be reset via line 60. When this occurs, the Q# terminal rises in potential but this alone does not change the output of gate 34. The output from this gate does not change until the trailing edge of the signal from the Q terminal propagates through the model 37 and the three inverters before reaching gate 34. This then causes the output of the gate to drop in potential initiating precharging.

Importantly, it should be noted that at the beginning of the read or write cycle, the delay through the decoder model 37 causes some of the control signals, such as those generated at the output of the bit line model detector 42 (line 17x/18x) to be delayed because of the delay through the decoder model when the flip-flop 33 is set. At the end of the cycle when the flip-flop 33 is reset the delay through the decoder 37 again is used, this time to delay the initiation of the charge cycle at the output of gate 34. (The leading and trailing edges of the output of the flip-flop 33 are each delayed.) Therefore, the delay of the model 37 and other delays associated with other models are used twice in a given cycle, once when the flip-flop 33 is set and again when it is reset to assist, for example, in providing leading and trailing edges to the control signals shown in FIG. 2. Also the delay through the models is used to reset the flip-flop 33.

Figure 5:
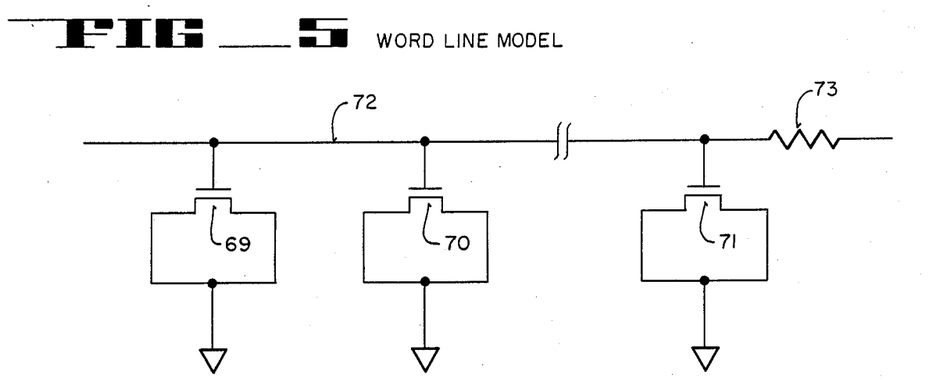
FIG. 5 is an electrical schematic illustrating a word line model used with the present invention.

The output of the decoder model 37 is coupled to a word line model 38. The word line model shall be described in conjunction with FIG. 5. The output of the word line model is coupled to a cell read model 41 and to a cell write model 49. In the currently preferred embodiment of the present invention, the decoder model and word line model are used for the generation of both the read and write control signals. However, there are separate bit line models and cell models for generating some of the control signals for reading and writing. Moreover, during writing a write device mode 43 is used.

In the case of the read cycle timing circuits, the output of the word line model 38 controls a cell read model 41 which is coupled to a bit line read model 40. The bit line read model and cell read model "duplicate" the bit line and cell during reading as will be described later in the application. A bit line detector model 42 is coupled to the cell read model and bit line read mode. The output of this model is coupled to one input terminal of the NOR gate 47 and also provides a signal on line 17x/18x which after buffering provides the control signals 17a and 18a of FIG. 2.

The output of the word line model 38 is also coupled to a cell write model 49. This model is coupled to a bit line write model 48 which is different than model 40. The output of the cell write model 49 is coupled directly to the gate 47.

A write enable signal is applied to one input of the NAND gate 50. This gate also receives the Q output of flip-flop 33. The output of gate 50 provides one input to gate 54. After this signal has passed through inverters 118 and 119, it is coupled to the other input terminal of gate 54. The output of inverter 119 is coupled to one additional inverter 120 and then is coupled to the write driver model 43. The complement of the signal on line 57 is coupled to the cell read model and as will be seen from FIG. 4, this signal is also coupled to the model 40 and used to prevent activation of these models during a write cycle. The output of the gate 54 provides the write pulse after buffering (signal 25a).

PREFERRED EMBODIMENTS OF THE PRESENT INVENTION

The present invention is used in a cache memory. This memory has two sections, a data section and an instruction section. Each of these sections has two arrays, one for storing data/instructions and the other for storing tag information. Each array of each section has its own timing circuits such as shown in FIGS. 3 and 4. The specific circuit of FIG. 4 is the timing circuit for the tag array of the data section. The other timing circuits are substantially the same, with the primary difference being the number of devices used in the bit line models for the read and write modes.

The data tag array has 128 cells coupled to each bit line. Its bit line model for the read mode uses 32 devices (see FIG. 6), and 64 devices for the write mode. The data array has 256 cells coupled to each bit line; it uses 64 devices in its bit line read model, and 64 devices in its bit line write model. The instruction tag array has 128 cells coupled to each bit line. It uses 16 devices in its bit line read model and 64 devices in its bit line write model. The instruction array has 256 cells coupled to each of its bit lines and it uses 80 devices in its bit line read model and 168 devices in its bit line write model. Thus, in each instance, the bit line word models are scaled down from the actual bit lines in that the actual bit lines have more devices coupled to them.

WORD LINE AND BIT LINE MODELS

The word line model (model 38 of FIGS. 3 and 4) is a full scale model. It is thus a duplicate of the actual word line used in the arrays. It consists of a line 72 shown in FIG. 5 with a plurality of transistors coupled to the line such as transistors 69, 70 and 71. In the currently preferred embodiment, the word line itself is fabricated from polycrystalline silicon (polysilicon); the resistance inherent in this line is shown as resistor 73. The same resistance is present in the model of the word line. Each of the transistors connected to the word line model such as transistor 69 is the same size (i.e., channel width and length dimensions) as the select transistors coupled to the word line. That is, the transistors in the model are the same size as transistor 19 of FIG. 1. There are two transistors in the word line model coupled to line 72 for each cell connected to the word line since, as shown in FIG. 1, a cell is selected through a pair of transistors. (For a 128 bit wide word, there are 256 transistors coupled to each word line.) Therefore, the word line model provides the same capacitance as an actual word line in the array. Note that this capacitance varies in the actual memory array from die to die because of ordinary process variations. Importantly, variations are matched by variations in the word line model since the model is fabricated on the same die with the actual cache memory.

Figure 6:
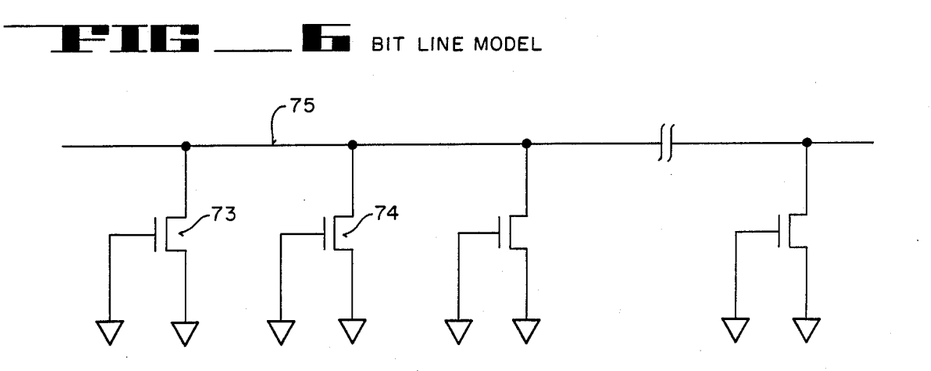
FIG. 6 is an electrical schematic of a bit line model used with the present invention.

The bit line model of FIG. 6 includes a plurality of transistors such as transistors 73 and 74 coupled to line 75. The gate and one terminal of each transistor is coupled to ground and the other terminal of each transistor is coupled to line 75. These n-channel transistors match transistor 19 of FIG. 1 and hence, duplicate the loading of the unselected cells on a bit line. As mentioned, fewer of these transistors are used in the bit line models than is found in the actual array, that is, they are scaled down. The bit line model of FIG. 6 is used for the bit line read model 40 and the bit line read model 48 of FIG. 4.

PREFERRED EMBODIMENT OF FIG. 4

Referring now to FIG. 4 the one shot 32 and flip-flop 33 of FIG. 3 is shown within the dotted lines 32–33. The input line 30 is coupled through three inverters 75, 76 and 77, there being capacitance loading at the output of each of these inverters. The inverter 77 is coupled to the gate of the n-channel transistor 80. The enable signal is coupled to the gate of the n-channel transistor 81. Line 30 is also common with the gate of the n-channel transistor 79. The reset signal from the gate 47 is coupled to the gate of the p-channel transistor 78. Transistors 78, 79, 80 and 81 are coupled in series. A latch is formed by the inverters 83 and 84 with the Q output being provided by the output of the inverter 84 and the Q# output by the output of the inverter 83.

The line 29x is coupled to the Q output of the flip-flop through three inverters. As shown in FIG. 3, this line is again effectively ANDed with the clocking signal at gate 44 to assure that the signal 28 does not occur unless the clocking signal is present.

The signal on line 31x is the Q# output of the flip-flop after passing through an inverter.

The gate 34 is again shown in FIG. 4 with its output coupled through inverters 100 and 101 to provide the line 16x. The line 16x is coupled through inverters 102 and 103 to the gate of the p-channel transistor 104 to provide the sense amplifier strobe signal on line 18x. The output of the inverter 105 maintains this signal in its inactive state during the write mode.

The Q output from the flip-flop 33 is coupled to one input terminal of NAND gates 106 and 50. The decoder model comprises the NAND gate 106 and inverter 107. Its output is coupled to the word line model 38 shown in FIG. 5 and also through three inverters to the other input terminal of the gate 34.

The Q# output of the flip-flop 33 is also used to precharge the bit line read model 40 and the cell read model 41. This is done through the NOR gate 86 which receives as one input the Q# output of the flip-flop 33. The output of the gate 86 is coupled through two inverters to line 89. The bit line read model 40 is charged through transistor 90. The cell read model is activated through transistor 91 which is also coupled to line 89. The signal on line 89 precharges the bit line model when it is low and then activates the cell read model through transistor 91 when it transitions to its high state. The bit line read model and cell read model are not activated during write cycles since the signal on line 57 is coupled to the other input terminal of the gate 86.

The output of the model 38 is coupled to the gate of transistor 92 to duplicate the selection of a single cell along the bit line during reading. Thus, in the cell read model 41, transistor 92 is a scaled up version of the selected transistor while transistor 91 is a scaled up version of one of the n-channel transistors of the cell itself. The cell read model provides "drive" to the bit line read model 40 to provide an output signal which is coupled to the input of the inverter 108. During a read cycle the bit line model 40 is first charged and then discharged through the cell read model comprising transistors 91 and 92. The bit line model detector comprises the inverters 108, 109 and 110. The cell read model provides approximately two times the amount of drive as an actual cell in the array. Again, its characteristics vary in the same manner as the characteristics of an actual cell since it is processed on the same die. Because of the increased drive and since the read bit line model 40 has less capacitance than an actual bit line, the signal resulting at the input to the inverter 108 is greater than the signal that appears on the actual bit line in the array. This allows the detector (inverters 108, 109, and 110) to be relatively simple. The fact that more signal is present allows for easy detection and a faster, more reliable generation of the timing signal.

The output of inverter 110 is coupled to one input terminal of the gate 47 to provide the reset signal during the read mode and is coupled through two inverters to gate 111. The output of gate 111 is coupled through a plurality of inverters to provide the isolation signal 17a from line 17x.

The write select signal, as mentioned, is applied to line 57 during write modes. This signal is coupled to the gate 50 and then through three inverters to line 113. This signal is effectively gated through gate 50 by the Q output of the flip-flop 33. Line 113 is in it slow state except during the write mode and hence, transistor 112 assures that the bit line write model 48 is charged. When the write mode is selected, transistor 112 is turned off and the write drive model 43 is activated by the signal on line 113 and the signal on line 57. The transistors 114 and 115 duplicate the write driving circuitry for driving the bit lines, particularly the circuitry associated with the inverter 28 and transistor 66 of FIG. 1.

The cell write model comprises transistors 95 and 96 and the inverters 97 and 98. The model is charged through transistor 99. The word line input to the model 49 is coupled to the gates of transistors 95 and 96 which duplicate the select transistors. The cell itself is represented by the inverters 97 and 98. The inverter 116 detects when the cell has been "set" by a data signal and the output of this inverter through the gate 47 provides a reset signal to the flip-flop 33 during the write mode. The signal on line 57 through gate 50 and a delayed version of this signal (delayed by inverters 118 and 119) are coupled to the gate 54. The output of gate 50 provides the write select signal 25a (line 25x).

The inputs to gate 54 are also coupled to the inputs of gate 117. The output of gate 117 through gate 111 and three inverters provide the isolation signal during the write mode.

During the write mode, as mentioned, the bit line write model 48 is scaled down compared to the actual line. The write drive model 43 is also scaled down. The signal waveform seen, for example, at the input to gate 116 duplicates the actual waveforms found in the array since the scaling down of both models 43 and 48 compensate one another.

The delay associated with the decoder model 37 and word line model 38 is equal to the delays associated with the actual decoder and word line in the array. The delay associated with the bit line read model and the cell read model is also equal to the delay associated with the actual bit line and cell. This equivalency of time delay is also true for the write models. Thus, the circuit of FIG. 4 provides delays equal in time to those associated with the real array. Since the circuit of FIG. 4 is formed on the same die as the actual arrays, the timing circuits will be affected to the same degree and in the same direction by process variations as the circuits of the array. Therefore, forexample, if a particular memory has large capacitance and operates more slowly than another, so will its associated timing circuitry.

The control signals on the lines 16x, 17x, 18x, 25x and 51x of FIG. 4 occur prior in time to the control signal applied to the array. This is necessary since, as mentioned, the signals on these lines are coupled to additional buffering (e.g., inverters, gates, etc.) before actually being coupled to the array. Since these signals must occur prior in time, the entire operation of the timing circuit although taking the same amount of time is shifted to an earlier time. This is simply done by providing less delay to the signal on line 30 before it is coupled to the timing circuit.

Thus, a timing circuit has been described which includes a plurality of models including scaled models for providing timing signals to a memory array.

I claim:

1. In a memory having memory cells, a first plurality of said memory cells coupled to a bit line and a timing circuit for providing a plurality of control signals to control reading of data from said first plurality of memory cells, an improvement in said timing circuit comprising:

a bit line model comprising a second plurality of at least a portion of said memory cells, said second plurality being fewer in number than said first plurality, said bit line model having a scaled capacitance which is less than the capacitance of said bit line with said first plurality of memory cells;

driving means coupled to said bit line model for driving said bit line model to duplicate reading of data from one of said first plurality of memory cells, said driving means producing a stronger signal on said bit line model than is obtained on said bit line when reading one of said first plurality of memory cells, detection means coupled to said bit line model for detecting said stronger signal on said bit line model, said detection means providing an output used in the generation of one of said control signals.

2. The improvement defined by claim 1 including a word line model comprising a third plurality of at least a portion of said memory cells, said third plurality being approximately equal in number to the number of said memory cells coupled to a word line in said memory.

3. The improvement defined by claim 2 including a decoder model comprising a model of a decoder in said memory, said decoder model being coupled to said word line model.

4. The improvement defined by claims 1 or 3 wherein said output of said detection means occurs at a point in time before a corresponding output would occur from said first plurality of said memory cells, said output being buffered before being applied to said first plurality of memory cells..

5. The improvement defined by claim 1 wherein said memory is a cache memory having a tag section and a data section and wherein each of said sections has a different one of said bit line models and driving means.

6. The improvement defined by claims 1 or 5 wherein said bit line model comprises a plurality of field-effect transistors coupled to a line; each of said transistors corresponding in size to transistors in said memory cells which couple said cells to said bit line.

7. In a memory having memory cells, a first plurality of said memory cells coupled to a bit line, an improved timing circuit for providing a plurality of control signals to control writing of data into said memory, comprising:

a bit line model comprising a second plurality of at least a portion of said memory cells, said second plurality being fewer in number than said first plurality, said bit line model having a scaled capacitance which is less than the capacitance of said bit line coupled to said first plurality of cells;

a cell model coupled to said bit line model for providing loading on said bit line model;

driving means coupled to said bit line model for driving said bit line model to duplicate writing of data into said cell model, said driving means providing a model signal level on said bit line model approximately equal to the corresponding signal level on said bit line during writing;

detection means coupled to said bit line model for detecting said model signal, said detection means providing an output used in the generation of at least one of said control signals.

8. The timing circuit defined by claim 7 wherein said bit line model comprises a plurality of field-effect transistors coupled to a line; each of said transistors corresponding in size to transistors in said memory cells which couple said cells to said bit line.

9. The improvement defined by claim 1 wherein said portion of said memory cells in said bit line model represent unselected ones of said memory cells.

10. The timing circuit defined by claim 7 including a word line model comprising a third plurality of at least a portion of said memory cells, said third plurality being approximately equal in number to the number of said memory cells coupled to a word line in said memory.

* * * * *

UNITED STATES PATENT AND TRADEMARK OFFICE
CERTIFICATE OF CORRECTION

PATENT NO. : 4,926,387
DATED : 5/15/90
INVENTOR(S) : Madland

It is certified that error appears in the above-identified patent and that said Letters Patent is hereby corrected as shown below:

col. 05, line 20   delete "mode"   insert --model--

Signed and Sealed this

Twenty-fifth Day of May, 1993

Attest:

MICHAEL K. KIRK

Attesting Officer   Acting Commissioner of Patents and Trademarks